(12) United States Patent
Nguyen

(10) Patent No.: US 6,483,872 B2
(45) Date of Patent: *Nov. 19, 2002

(54) METHOD AND APPARATUS FOR REDUCING CONVERGENCE TIME

(75) Inventor: Thi N. Nguyen, Carrollton, TX (US)

(73) Assignee: STMicroelectronics, Inc., Carrollton, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/140,756

(22) Filed: Aug. 25, 1998

(65) Prior Publication Data

US 2001/0031000 A1 Oct. 18, 2001

(51) Int. Cl.$^7$ .................................................. H03H 7/40
(52) U.S. Cl. ...................... 375/231; 375/232; 375/350; 708/305; 708/323
(58) Field of Search .............................. 375/229, 230, 375/231, 232, 233, 346, 350, 285; 708/300, 305, 322, 323

(56) References Cited

U.S. PATENT DOCUMENTS

| | | | | |
|---|---|---|---|---|
| 5,022,082 A | * | 6/1991 | Eriksson et al. ............... 381/71 |
| 5,056,117 A | * | 10/1991 | Gitlin et al. .................. 375/102 |
| 5,146,470 A | * | 9/1992 | Fujii et al. .................... 375/103 |
| 5,267,320 A | * | 11/1993 | Fukumizu ...................... 381/71 |
| 5,398,029 A | * | 3/1995 | Toyama et al. ................ 341/61 |
| 5,448,601 A | * | 9/1995 | Choi ............................ 375/232 |
| 5,513,223 A | * | 4/1996 | Shoji ........................... 375/231 |
| 5,654,765 A | * | 8/1997 | Kim ............................ 348/614 |
| 5,668,747 A | | 9/1997 | Ohashi ..................... 364/724.19 |
| 5,712,873 A | * | 1/1998 | Shiue et al. ................. 375/233 |
| 5,727,073 A | | 3/1998 | Ikeda ......................... 381/94.7 |
| 5,781,463 A | | 7/1998 | Ogawa et al. ........... 364/724.19 |
| 5,999,567 A | * | 12/1999 | Torkkola ..................... 375/232 |
| 6,012,161 A | * | 1/2000 | Ariyavisitakul et al. ..... 714/795 |
| 6,078,614 A | * | 6/2000 | Brown et al. ................ 375/232 |

FOREIGN PATENT DOCUMENTS

| | | | |
|---|---|---|---|
| EP | 0 515 761 A1 | 12/1992 | ........... H04L/25/03 |
| FR | 2 669 493 A1 | 5/1992 | ............ H04N/5/21 |

* cited by examiner

Primary Examiner—Stephen Chin
Assistant Examiner—Dac V. Ha
(74) Attorney, Agent, or Firm—Lisa K. Jorgenson; Christopher F. Regan

(57) ABSTRACT

A method and apparatus for reducing convergence time in a digital filter. When the digital filter is initially run, the coefficients in the digital filter are adjusted to reduce error in the output of the digital filter. When the adjusted coefficients meet a selected error level, these coefficients are stored in a memory and the digital filter filters data. The next time the digital filter is run, the stored coefficients are loaded into the digital filter and a number of iterations are run in which the coefficients are adjusted. Then, a determination is made as to whether the error level meets a threshold that may be the same as the selected error level. If the coefficients meet the threshold, the coefficients are stored in the memory and the filter is then used to filter data. A number of sets of coefficients may be stored in the memory and a set of coefficients unable to meet the threshold is replaced with another set of coefficients until the threshold is met or untested sets of coefficients are no longer present in the memory. At that time, a default set of coefficients may be used.

19 Claims, 9 Drawing Sheets

METHOD AND APPARATUS FOR REDUCING CONVERGENCE TIME

BACKGROUND OF THE INVENTION

1. Technical Field

The present invention relates generally to data processing and in particular to digital signal transmission. Still more particularly, the present invention relates to an equalizer with rapid time convergence.

2. Description of the Related Art

Digital signal processing is concerned with the digital representation of signals and the use of digital processors to analyze, modify, or extract information from signals. Most signals are analog in nature, meaning that they often vary continuously with time and represent variations of physical quantities, such as sound waves. The signals used in many digital signal processing (DSP) are derived from analog signals, which have been sampled at regular intervals and converted into a digital form. One reason for processing a digital signal may be, for example, to remove interference or noise from the signal, to obtain the spectrum of the data, or to transform the signal into a more suitable form. DSP is being used in many areas where analog processing was previously used. In addition, DSP allows for new applications, which were difficult or impossible using analog processing. DSP provides advantages, such as, for example, (1) accuracy is limited only by the number of bits used, (2) reproducibility in which performance is identical from unit to unit because no variations exists due to tolerances, and (3) no drift in performance is present with changes in temperature or age.

In DSP, digital filtering is one of the most important operations present. A common filtering objective in digital filtering is to remove or reduce noise from a wanted signal. A filter is essentially a system or network that selectively changes the wave-shape, amplitude-frequency characteristics of a signal in a desired manner. Common filtering objectives are to improve the quality of the signal. A digital filter is a mathematical algorithm implemented in hardware and/or software that operates on a digital input signal to produce a digital output signal for the purpose of achieving a filtering objective, such as reducing or eliminating noise. The term digital filter is used to refer to both hardware and software routines used to perform filtering functions. Digital filters often operate on digitized analog signals or just numbers, representing some variable stored in a computer memory.

Turing to FIG. 1, an illustration of a known process for filtering symbols is shown. Symbols 100 are transmitted by a transmitter to the receiver over a channel 102, which may result in distortion of the data to cause "fuzzy" data 104 to be received by the receiver. An equalizer 106 and a slicer 108 located in the receiver is employed to process the incoming waveform. Equalizer 106 is an adaptive digital filter in this example. Slicer 108 is used to determine the amount of error which is used to adjust coefficients in real time.

The time needed for an equalizer to reduce the transient errors below a steady state error level is known as the "convergence time". In other words, convergence time is how fast coefficients are fixed or adjusted to be effective in processing a signal. The classical conflict between speed and accuracy is well known in adaptive filter design. By making a step size (e=1) in the adjustment of the coefficients larger, the speed in convergence is increased, but the accuracy (M=1) is decreased. On the other hand, employing a very small step size (e<<1) increases accuracy with a decrease in speed. Small or fast convergence time requires high speed.

With reference to FIG. 2, a graph illustrating the problem of speed versus accuracy is depicted. Graph 200 shows time on the x-axis and mean square error on the y-axis. Curves 202 and 204 are learning curves averaged over five hundred iterations. Curve 202 represents a learning curve using a step size of 0.01 while curve 204 illustrates a learning curve for a step size of 0.05. As can be seen, curve 204 shows a faster convergence time than curve 202. In addition, accuracy is decreased in curve 204 when compared to the accuracy in curve 202. If the coefficients are adjusted too quickly through larger step sizes, the filter in the equalizer may become unstable. By using smaller step sizes, the time it takes to converge becomes unacceptable for many applications.

Therefore, it would be advantageous to have an improved method and apparatus for increasing the speed of convergence while maintaining accuracy.

SUMMARY OF THE INVENTION

The present invention provides a method and apparatus for reducing convergence time in a digital filter while maintaining a small step size. Initially, coefficients may be pre-loaded into the filter or training data may be used in which the coefficients in the digital filter are adjusted to reduce error in the output of the digital filter. When the adjusted coefficients meet a selected error level, these coefficients are stored in a memory and the digital filter filters data. The next time the digital filter is run, the stored coefficients are loaded into the digital filter and a number of iterations are run in which the coefficients are adjusted. Then, a determination is made as to whether the error level meets an acceptance threshold that the coefficients can be continuously used to reach an optimum threshold, which may be the same as the acceptance threshold, but is typically tighter than the acceptance threshold. If the coefficients meet the threshold, the coefficients are continuously adjusted until the optimum threshold is reached and the filter is then used to filter data. Otherwise, the filter is loaded with another set of coefficients from memory and the process is repeated until the last set of coefficients is loaded. If none of the sets of coefficients meet the acceptance threshold, the filter has no choice but to use the normal convergence process. A number of sets of coefficients may be stored in the memory and a set of coefficients unable to meet the threshold is replaced with another set of coefficients until the threshold is met or untested sets of coefficients are no longer present in the memory. At that time, a default set of coefficients may be used.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION

Figure 1:
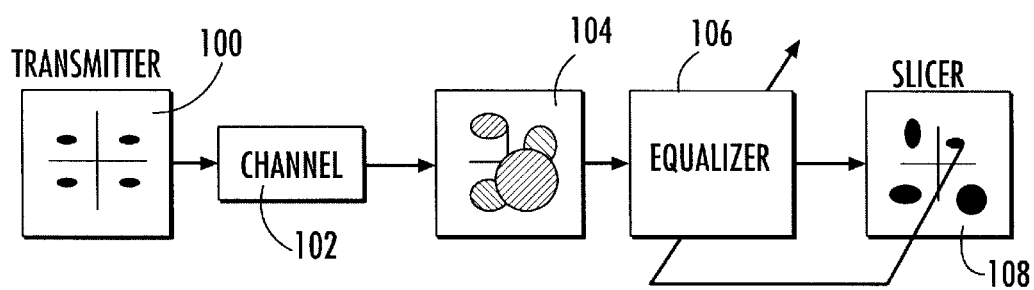
FIG. 1 is an illustration of a known process for filtering symbols.
Figure 2:
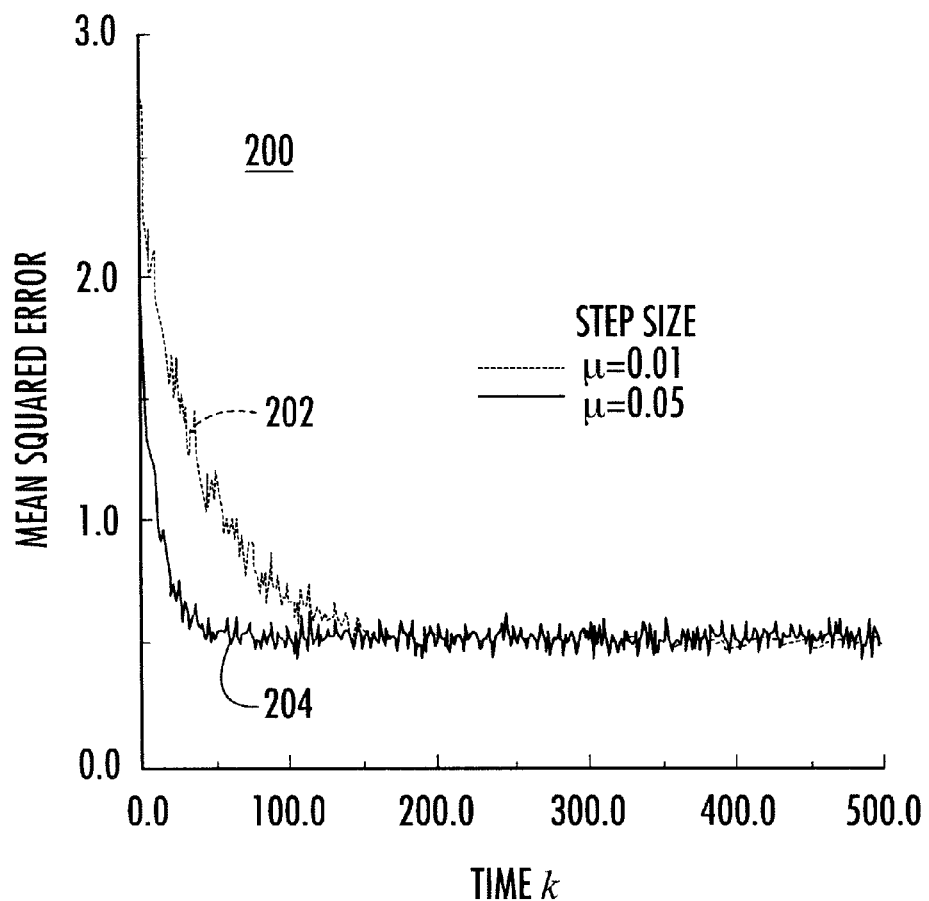
FIG. 2 is a graph illustrating a known problem of speed versus accuracy in convergence to a selected error level.

Corresponding reference numerals in different figures are employed to identify corresponding elements of the present invention unless indicated otherwise. The present invention provides a method and apparatus for adjusting coefficients in a manner that provides for fast convergence. With reference now to the figures and in particular with reference to FIG. 3, a block diagram of a communications system in which the present invention may be implemented is depicted in accordance with a preferred embodiment of the present invention. Communications system 300 includes a transmitter 302 and a receiver 304 connected to each other by a communications link 306, also referred to as a "channel" in the depicted examples. Transmitter 302 and receiver 304 may be found in almost any type of data processing system that sends and/or receives data. For example, transmitter 302 and receiver 304 may be found within a modem in a computer in which communications link 306 may be a coaxial or fiber optic cable.

Figure 3:
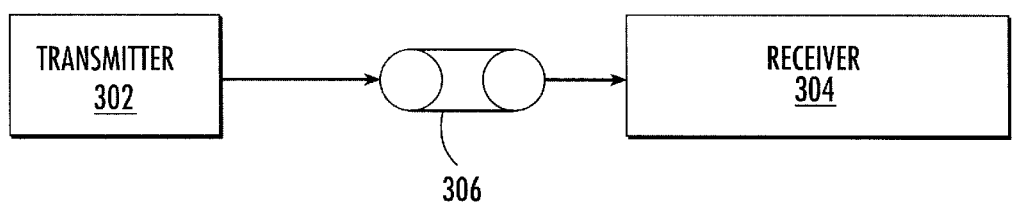
FIG. 3 is a block diagram of a communications system in which the present invention may be implemented in accordance with a preferred embodiment of the present invention.
Figure 4:
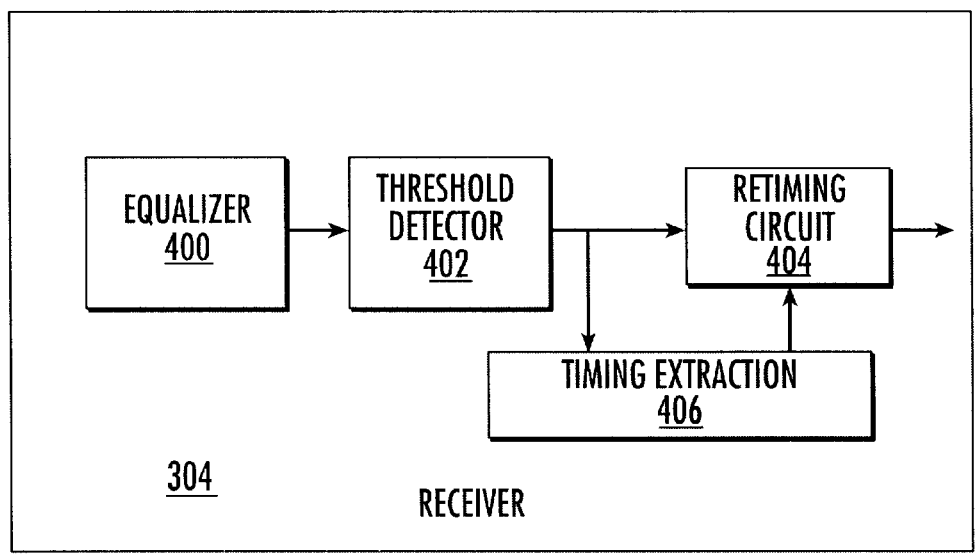
FIG. 4 is a block diagram of a receiver from the communications system in which the present invention may be implemented in accordance with a preferred embodiment of the present invention.

With reference next to FIG. 4, a block diagram of a receiver from the communications system in FIG. 3 in which the present invention may be implemented is illustrated in accordance with a preferred embodiment of the present invention. Receiver 304 includes an equalizer 400, a threshold detector 402, a retiming circuit 404, and a timing extraction unit 406. Equalizer 400 receives a waveform such as, for example, a binary symbol. The received waveform is "sharpened" such that output signals at equalizer 400 are clearer. The processed waveform is then sent to threshold detector 402, which is a circuit whose output is one of two voltage levels depending on whether the input is greater or less than a pre-set threshold. Threshold detector 402 generates a binary signal that is very similar to the signal sent by a transmitter. Retiming circuit 404 is employed to retime the waveform so that transitions of the waveform are in step or correspond to those of the waveform sent by the transmitter. Retiming circuit 404 is employed to avoid irregularities (also called "jitter") in the output of threshold detector 402 that may build up and cause errors. Timing extraction unit 406 is used to create a frequency signal from the waveform generated by threshold detector 402. This frequency signal is used by retiming circuit 404 in retiming the waveform to produce a regenerated digital signal. The processes of the present invention may be implemented within equalizer 400 in accordance with a preferred embodiment of the present invention.

Figure 5:
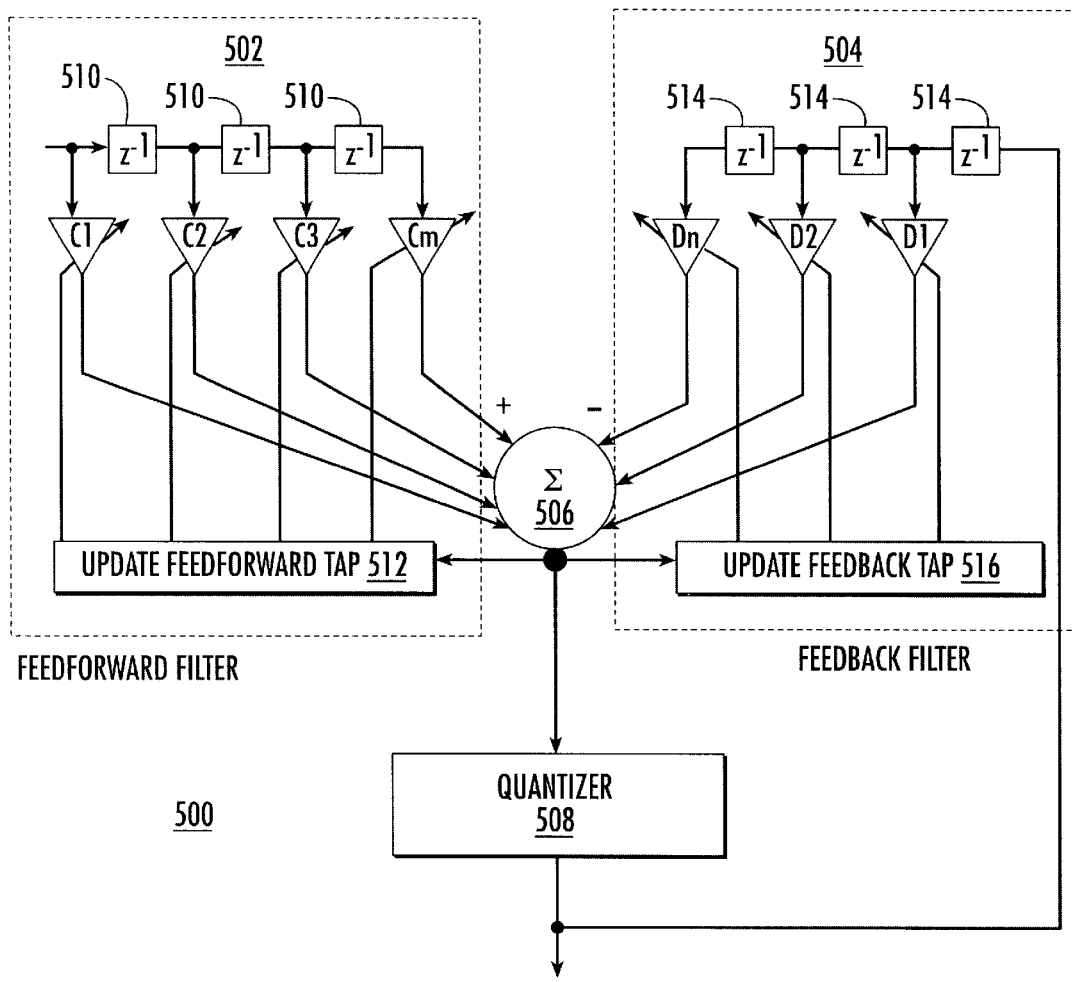
FIG. 5 is a block diagram of an equalizer in accordance with a preferred embodiment of the present invention.

Turning next to FIG. 5, a block diagram of an equalizer is depicted in accordance with a preferred embodiment of the present invention. Equalizer 500 includes two digital filters: a feedforward filter 502 and a feedback filter 504. Feedfoward filter 502 is a finite impulse response (FIR) filter while feedback filter 504 is an infinite impulse response (IIR) filter. These filters have their outputs connected to a summing node 506. The output of summing node 506 is connected to a quantizer 508. The output of quantizer 508 provides the output of equalizer 500, while the input of feedforward filter 502 is the input of equalizer 500. Feedforward filter 502 includes delay elements 510 and taps C1 through Cm, which multiply the delay value by the coefficient contained in each of the taps. Update feedforward tap 512 is employed to update coefficients within taps C1 through Cm. New coefficients may be generated by update feedforward tap 512 in response to error signals generated by comparing the output of summing node 506 to a pre-stored or preprogrammed signal within update feedforward tap 512. The pre-stored signal may be a training sequence sent through the filter when the filter was initially run to adjust the coefficients.

Feedback filter 504 contains delay elements 514, update feedback tap 516, and taps D1 through Dn. Like taps C1 through Cm, taps D1 through Dn multiply the delay by coefficients loaded into each of the taps. The output of taps D1 through Dn are sent to summing node 506. The error signal generated by comparing the output of summing node 506 to a pre-stored or preprogrammed signal in update feedback tap 516 is used by update feedback tap 516 to update coefficients in taps D1 through Dn.

The filters may contain different number of coefficients depending on the implementation or application. Each filter 502 and 504 may contain any number of coefficients. For example, filters 502 and 504 may contain 32 coefficients with 12 coefficients in filter 502 and 20 coefficients in filter 504. The first time a filter is used or run, the initial coefficients may be initialized by the user with a set of preselected coefficients chosen during the system design or by running a training sequence through the filter. This training sequence may be, for example, a repeating incremental step function, such as 0 to 256 repeated a number of times.

The most common algorithm implemented within these depicted filters is a least mean square algorithm, which adjusts all of the coefficients in steps until the transient error generated by summing node 506 is below some selected steady state error level. The time needed for equalizer 500 to reduce the transient errors below a steady state error level is known as the "convergence time". In addition, from a mathematical view point, the convergence time increases linearly with the number of taps or delay units and is proportional to the signal to noise ratio (SNR) at the filter output. Thus, it is impossible to improve the convergence time beyond the mathematical minimum. The present invention, however, provides a solution to the classic conflict between speed and accuracy that is present in adaptive filters.

Figure 6:
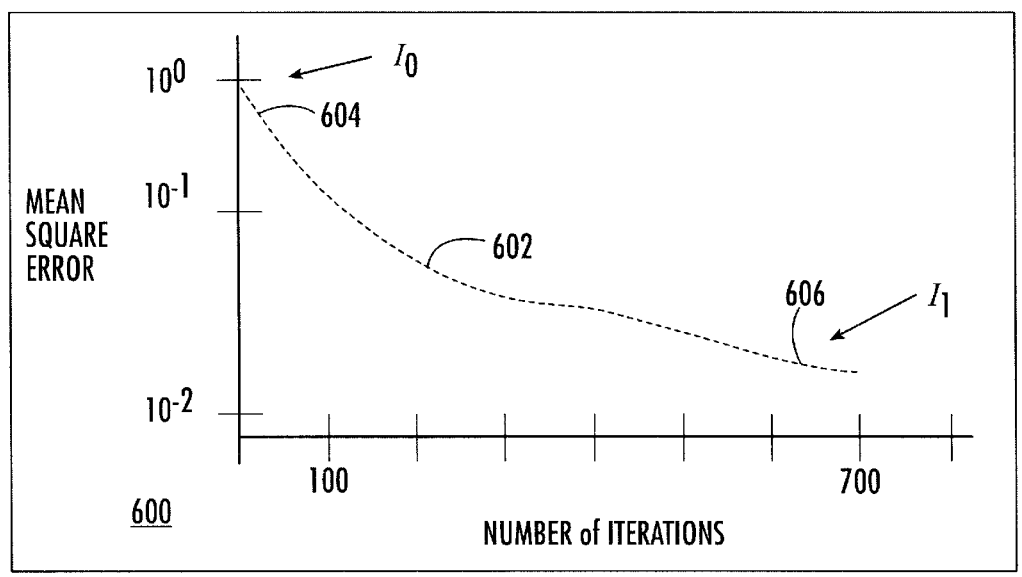
FIG. 6 is a graph illustrating the selection process used in accordance with a preferred embodiment of the present invention.

In particular, the present invention provides a method and apparatus for reducing convergence time without sacrificing accuracy through picking a better initialization value. The present invention provides an improved process and apparatus for selecting a better set of coefficients to begin the convergence process. With reference to FIG. 6, a graph illustrating the selection process used in selecting coefficients is depicted in accordance with a preferred embodiment of the present invention. Graph 600 contains the number of iterations on the x-axis and the means square error on the y-axis. Curve 602 shows the convergence in a filter through updating coefficients. With initial tap coefficients at point 604, 700 iterations are required in the depicted example to reduce the mean square error to 0.01. On the other hand, the present invention provides a process and apparatus for selecting initial coefficients at point 606, which reduces the number of iterations to 100 to reach the same 0.01 means square error level in the depicted example.

Figure 7:
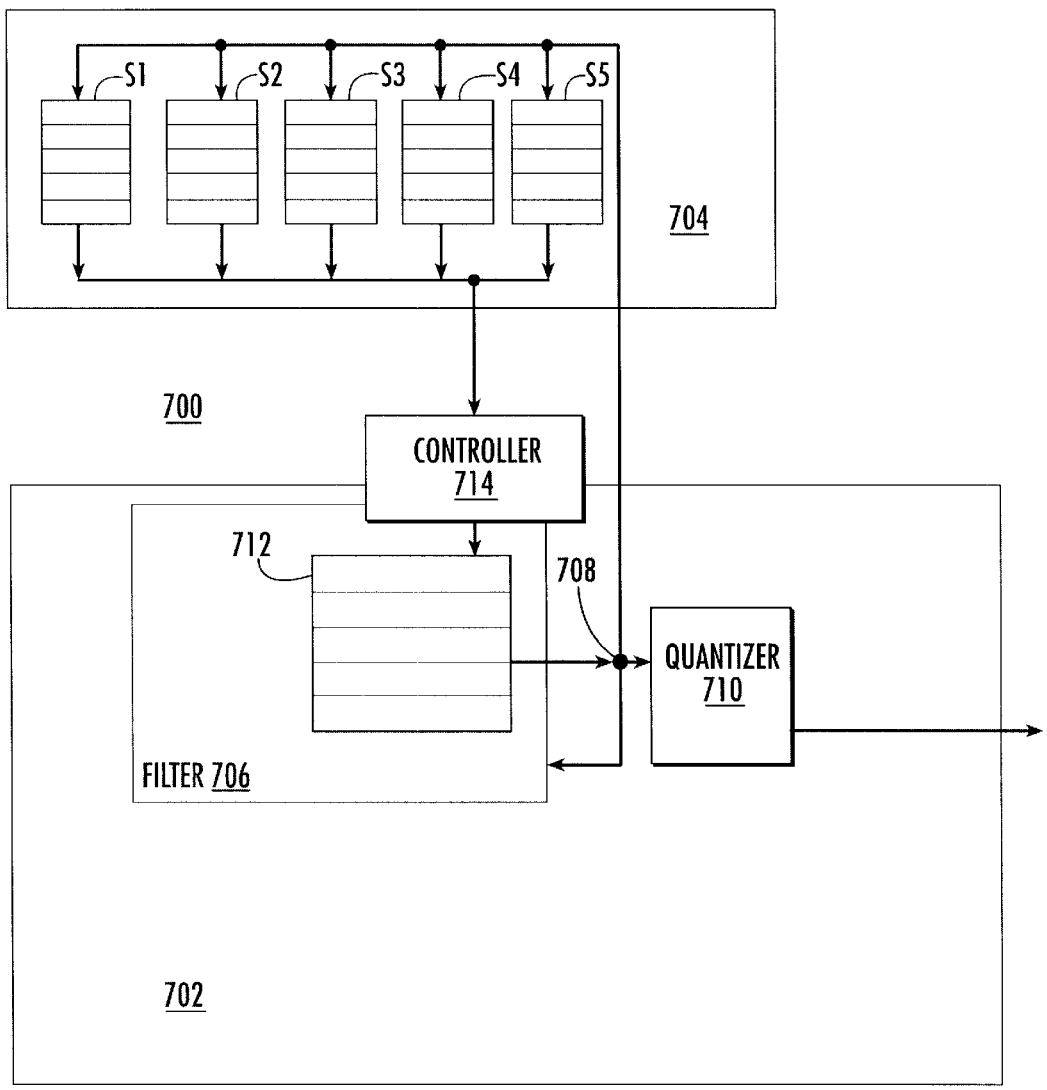
FIG. 7 is a block diagram of a guided equalizer depicted in accordance with a preferred embodiment of the present invention.

With reference now to FIG. 7, a block diagram of a guided equalizer is depicted in accordance with a preferred embodiment of the present invention. Guided equalizer 700 includes equalizer 702 and storage 704. Equalizer 700 includes a filter unit 706, summing node 708, and a quantizer 710. Filter unit 706 contains coefficients 712, which are the same as those used the coefficients units in FIG. 5. In particular, when equalizer 702 is first run, the filter unit 706 within equalizer 702 will run normally to find a convergence point. When a convergence point is found, coefficients 712 are stored in storage 704, which is an internal memory in the depicted example. The storing of the coefficients to storage 704 is performed by controller 714, which in the depicted example may be implemented within update taps, such as, for example, update feedforward tap 512 and update feedback tap 516 in FIG. 5. Of course a separate controller may be implemented depending on the implementation of the present invention. Guided equalizer 700 can store N sets of coefficients, S1 through Sn, before having to overwrite a previous set of stored coefficients.

After the initial run, every time filter unit 706 is rerun, controller 714 will have filter unit 706 test all N sets of coefficients stored in storage 704 for M programmable iterations. The coefficients are loaded into taps in filter unit 706 by controller 714. If any of the sets of coefficients stored in storage 704 satisfies a programmable error threshold, also called an "acceptance threshold", that set of coefficients will be used as the initial coefficients values for operating the filter. If none of the sets of coefficients stored in storage 704 meets acceptance threshold, a default set of coefficients or the last set of coefficients tested may be used in operating the filter.

Figure 8:
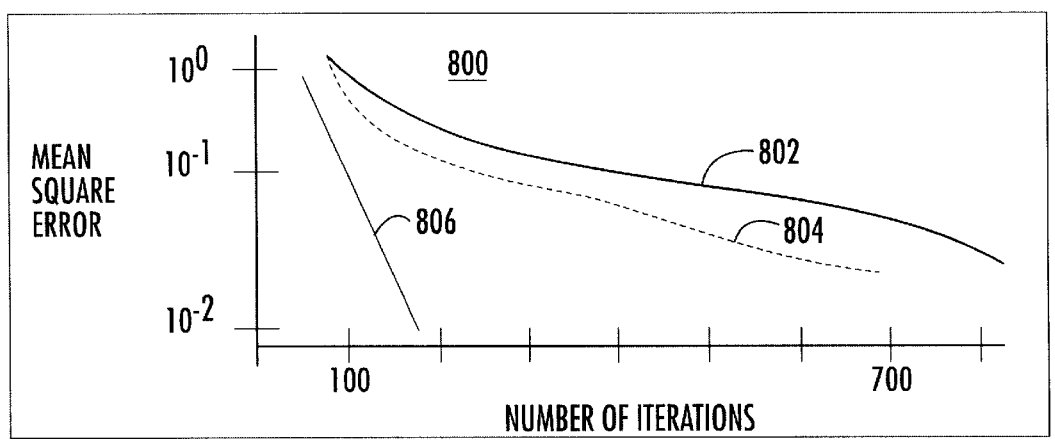
FIG. 8 is a graph showing convergence using a guided equalizer in accordance with a preferred embodiment of the present invention.

Turning to FIG. 8, a graph showing convergence using a guided equalizer is depicted in accordance with a preferred embodiment of the present invention. In graph 800, the x-axis represents the number of iterations while the y-axis shows the means square error. Curve 802 shows a worst case situation for convergence to a selected mean square error level while curve 804 illustrates convergence in an initial run of a guided equalizer. Curve 806 depicts convergence in which previous runs have been made and coefficients stored from those runs are used as initial coefficients. Convergence iterations may be determined in the following manner:

$CI_W = (N \times M) + \Delta$ $CI_B = M$ $CI_{first} = \Delta$ where CI is the total number of convergence iterations (W is the worst, B is the best, first is the first time), N is the number of coefficient sets, M is the number of iterations, and $\Delta$ is the normal/regular convergence time.

Figure 9:
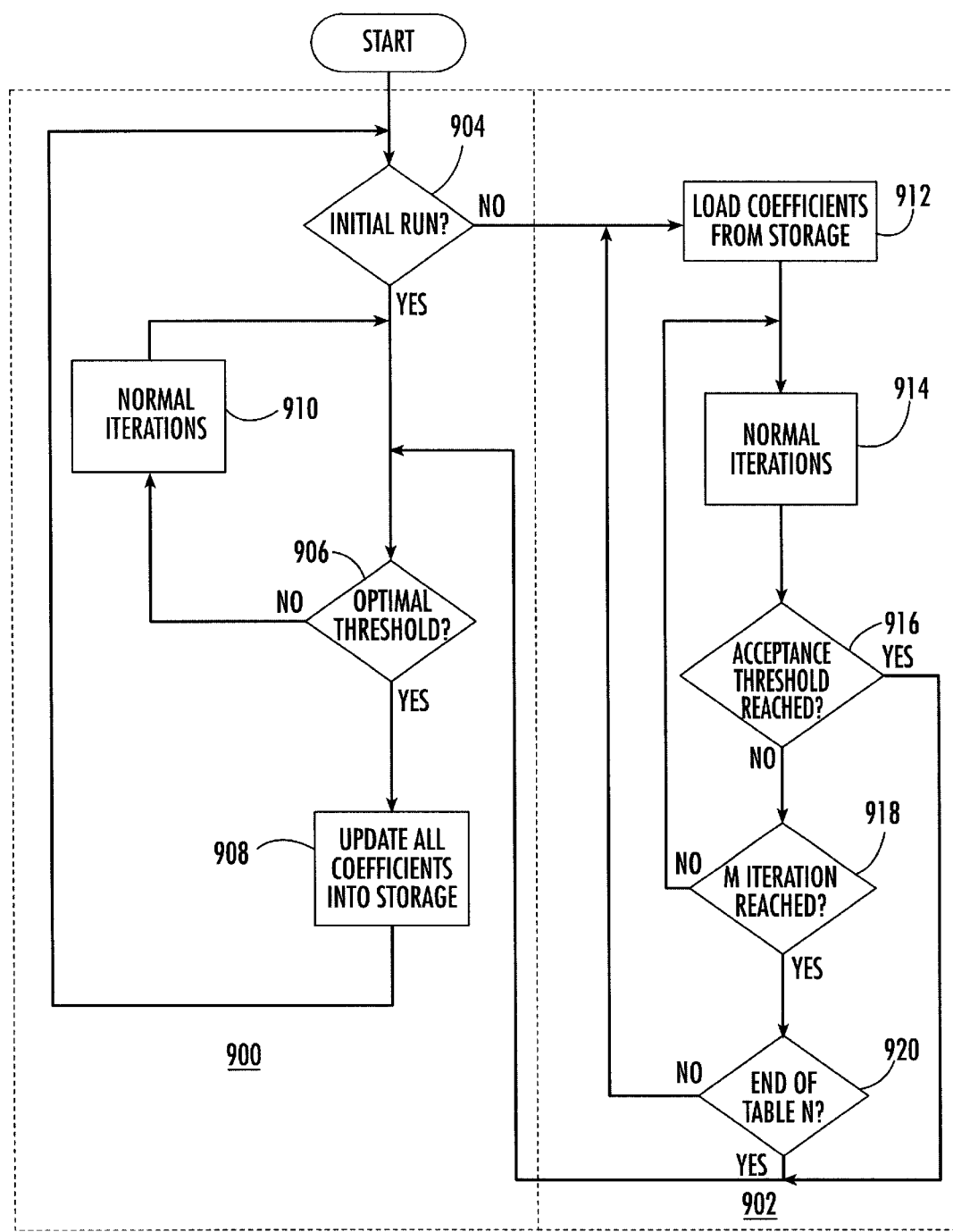
FIG. 9 is a flowchart of a process for selecting coefficients for an equalizer in accordance with a preferred embodiment of the present invention.

Turning now to FIG. 9, a flowchart of a process for selecting coefficients for a filter is depicted in accordance with a preferred embodiment of the present invention. The process in FIG. 9 includes a normal phase 900 and a testing phase 902. The process begins in normal phase 900, by determining whether an initial run is occurring (step 904). An initial run involves when the equalizer is being used for the first time or any time the filter is losing its optimum means square error. Typically, a filter run for the first time will have set of coefficients that are calculated during the design of the filter. If the coefficients are pre-loaded in memory, then the filter is not in an initial run. If the equalizer is performing an initial run, a determination is made as to whether the error threshold is acceptable (step 906). The error threshold in the depicted example is also referred to as an "optimum threshold". An optimal threshold in the depicted example is 0.1. The optimal threshold may be selected a number of ways. For example, the optimal threshold may be selected to be a number when a SNR is at an acceptable level through the system or a decodable in the system. If the optimum threshold is acceptable, the coefficients are stored (step 908) with the process then returning to step 904. When new sets of coefficients are found, older sets of coefficients may be replaced if the storage space is unavailable for the new set of coefficients. This replacement of coefficients may be based on many different schemes. For example, without limitation, the replacement may be least used, random, aging, or round robin.

In the depicted example, the coefficients are stored in a table located in a memory. With reference again to step 906, if the threshold is not acceptable, the process then performs normal iterations to identify new coefficients (step 910) with the process then returning to step 906 to determine whether the new coefficients have an acceptable threshold. These iterations may employ various known adaptive algorithms, such as for example (1) least mean square (LMS) adaptive algorithm or (2) a recursive least squares algorithm to calculate new coefficients to the taps. Such a process may be performed by an update tap.

With reference again to step 904, if the run is not an initial run, the process then enters testing phase 902, which begins by loading coefficients into the filter from the storage (step 912). Thereafter, normal iterations are performed (step 914). These iterations are similar to those described in step 910. Step 914 is used to refine the stored coefficients before comparing error in output generated by coefficients to the acceptance threshold. In effect, this step is used to set a tolerance level for stored coefficients. A determination is then made as to whether the acceptance threshold has been reached (step 916). The acceptance threshold is an error threshold that will result in the set of coefficients being selected for use in the filter. This threshold may or may not be the same as the threshold used in step 906. If the acceptance threshold has not been reached, the process then determines whether M iterations have occurred (step 918). In the depicted example M is 5 sets of coefficients. The value M, however, may be any number depending on the application. The acceptance threshold in this example is plus ten percent over the optimal threshold of 0.1. If M iterations have not occurred, a determination is made as to whether the end of the table has been reached (step 920). If the end of the table has been reached, the process the proceeds to step 906 as described above to see if the threshold is acceptable. With reference again to step 916, after the acceptance threshold has been reached, the process also proceeds to step 906. Referring back to step 920, if M iterations have not been reached, the process will return to step 914 to perform normal iterations. The process illustrated in FIG. 9 may be implemented in either hardware of software routines in accordance with a preferred embodiment of the present invention.

Thus, the present invention provides an improved method and apparatus for providing fast convergence time while minimizing the misadjustment or accuracy problems typically associated with reducing convergence time through larger step sizes. This advantage is provided by storing sets of coefficients generated by previous runs of the filter and using one of the sets of coefficients as the beginning values for the coefficients. By using this technique, run of a filter that normally takes seven thousand iterations may be reduced to about five hundred iterations by using an acceptance threshold to select a set of stored coefficients. The guided equalizer of the present invention may be used in any application in which an equalizer is required. For example, the processes and apparatus of the present invention may be implemented in a cable modem to process incoming data. The present invention may be applied to other areas, such as, for example, without limitation, blood pressure regulating systems, cellular phone equalizers, and biofeedback systems.

The description of the preferred embodiment of the present invention has been presented for purposes of illustration and description, but is not limited to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method for adaptively filtering a communications signal in a digital filter, the method comprising:
    running the digital filter with a set of coefficients in response to a run of the digital filter wherein the digital filter comprises a feed forward filter having an input for the digital filter and an output, a feedback filter having an output, a summing node connected to said outputs, and a quantizer connected to said summing node and outputting a signal for the digital filter, wherein each feed forward filter and feedback filter includes a plurality of delay elements and taps for multiplying any delay values from the delay elements by a coefficient contained in the taps, and an update tap and controller in each filter for generating new coefficients in response to error signals generated by comparing the output of the summing node to a prestored or preprogrammed signal within respective update taps;
    determining whether an output from the digital filter using a set of coefficients is equal to a selected error level;
    adjusting the coefficients within the set of coefficients until the output from the digital filter using the set of coefficients are equal to the selected error level in response to a determination that the output from the digital filter using the set of coefficients is unequal to the selected error level;
    storing the set of coefficients in a memory to form a stored set of coefficients; and
    loading the stored set of coefficients into the digital filter from the memory in response to subsequent runs of the digital filter while also operating in a selected plurality of modes of operation, wherein said modes of operation are selected responsive to the set of coefficients being unable to meet first and/or second error levels and operating until selected sets of different coefficients meets first and/or second error levels, wherein after an initial run by testing all "N" sets of coefficients stored in the memory for "M" programmable iterations, when any sets of coefficients satisfy an acceptable threshold, then using those coefficients as the initial coefficients values, and if not, then using a default set of coefficients or the last tested set of coefficients wherein N and M are integer.

2. The method of claim 1, wherein the run is an initial run of the filter using a training sequence.

3. The method of claim 2, wherein the stored set of coefficients forms a first set of stored coefficients and the active set of coefficients stored in the memory forms a second set of stored coefficients.

4. The method of claim 2, wherein the active set of coefficients replaces the stored set of coefficients.

5. The method of claim 1, wherein the stored set of coefficients loaded into the digital filter is an active set coefficients and further comprising:
    determining whether an output from the digital filter using the active set of coefficients meets the selected error level;
    adjusting the active set of coefficients until the output meets the selected error level; and
    storing the active set of coefficients in the memory.

6. The method of claim 1, wherein the digital filter is a finite impulse response filter.

7. The method of claim 1, wherein the digital filter is a infinite impulse response filter.

8. The method of claim 1, wherein the coefficients within the set of coefficients are adjusted using a least mean square algorithm.

9. A method for selecting coefficients for a digital filter, the method comprising:
    providing a memory containing a set of coefficients;
    loading a set of coefficients from the sets of coefficients into the digital filter to form an active set of coefficients wherein the digital filter comprises a feed forward filter having an output, a feedback filter having an input for the digital filter output, a summing node connected to said outputs, and a quantizer connected to said summing node and outputting a signal for the digital filter, wherein each feed forward filter and feedback filter includes a plurality of delay elements and taps for multiplying any delay values from the delay elements by a coefficient contained in the taps, and an update tap and controller in each filter for generating new coefficients in response to error signals generated by comparing the output of the summing node to a prestored or preprogrammed signal within respective update taps;
    running the digital filter to generate an output using the active set of coefficients for a number of iterations in which the active set of coefficients is adjusted for error in the output;
    determining whether the output generated using the active set of coefficients meets a selected error threshold after the number of iterations; and
    utilizing the active set of coefficients in response to the output meeting the selected error threshold while also operating in a selected plurality of modes of operation, wherein said modes of operation are selected responsive to the set of coefficients being unable to meet first and/or second error levels and operating until selected sets of different coefficients meets first and/or second error levels, wherein after an initial run by testing all "N" sets of coefficients stored in the memory for "M" programmable iterations, when any sets of coefficients satisfy an acceptable threshold, then using those coefficients as the initial coefficients values, and if not, then using a default set of coefficients or the last tested set of coefficients wherein N and M are integer.

10. The method of claim 9 further comprising:

storing the active set of coefficients in the memory in response to the output generated using the active set of coefficients meeting the selected error threshold.

11. The method of claim 10, wherein the selected error threshold is a first error threshold and further comprising:

continuing to monitor the output generated using plurality of active coefficients to determine whether the output using active set of coefficients meet a second error threshold;

adjusting the plurality of active coefficients for error until the output generated using the plurality of active coefficients meets the second error threshold; and storing the plurality of active coefficients in the memory.

12. The method of claim 9 further comprising:

loading another set of coefficients from the memory in response to the output using the active set of coefficients being unable to meet the selected error threshold, wherein the another set of coefficients form a second active set of coefficients;

running the digital filter to generate a second output using the second active set of coefficients for a number of iterations in which the second set of active coefficients is adjusted for error in the second output;

determining whether the second output using the second active set of coefficients meets a selected error threshold after the number of iterations; and utilizing the second active set of coefficients in response to the second output meeting the selected error threshold.

13. The method of claim 12 further comprising:

loading a default set of coefficients from the memory in response to all outputs, generated using all of the sets of coefficients located in the memory, being unable to meet the error threshold after the number of iterations.

14. An apparatus comprising:

a memory in which a set of coefficients is stored from a prior run of an equalizer in which an output from the set of coefficients provided a selected error in filtering data;

a filter including a feed forward having an input for the digital filter and output and feedback filter having an output, a summing unit connected to the outputs, and quantizer connecting to the summing unit, each feed forward and feedback filter including a plurality of delay units connected in series;

a plurality of taps, each tap having an input connected to a delay unit within the plurality of delay units and an output, wherein each tap multiplies a value from a delay unit by a coefficient;

an update tape and controller for generating new coefficients in response to error signals generated by comparing the output of the summing node to a prestored or preprogrammed signal within respective update taps;

wherein the summing unit sums the outputs from the plurality of taps to generate an output for the filter;

a control unit, wherein the control unit has a plurality of modes of operation including:

a first mode of operation in which the tap update unit loads the set of coefficients from the memory into the plurality of taps;

a second mode of operation, responsive to loading of the set of coefficients, for performing a number of iterations during which the set of coefficients is adjusted for error in the output for the filter;

a third mode of operation, responsive performing a number of iterations, in which the tap update unit determines if the output generated using the set of coefficients meets a first error level;

a fourth mode of operation, responsive to the set of coefficients meeting the selected error level, in which the control unit determines whether the output generated using the set of coefficients meets the second error level;

a fifth mode of operation, responsive to the output generated using the set of coefficients meeting the second error level, in which the control unit runs the filter using the set of coefficients;

a sixth mode of operation, responsive to the set of coefficients being unable to meet the second error level, in which the control unit adjusts the coefficients until the output generated using the set of coefficients meets the second error level, forming an adjusted set of coefficients; and a seventh mode of operation, responsive to adjustment of the set of coefficients until output generated using set of coefficients meets the second error level, in which the control unit stores the adjusted set of coefficients and runs the filter using the adjusted set of coefficients, wherein after an initial run by testing all "N" sets of coefficients stored in the memory for "M" programmable iterations, when any sets of coefficients satisfy an acceptable threshold, then using those coefficients as the initial coefficients values, and if not, then using a default set of coefficients or the last tested set of coefficients wherein N and M are integer.

15. The apparatus of claim 14, wherein the set of coefficients is a first set of coefficients and wherein the plurality of modes of operation further comprises:

an eight mode of operation, responsive to the output generated using the set of coefficients being unable to meet the first error level in the third mode of operation, in which the control unit loads a second set of coefficients and shifts to the second mode of operation.

16. The apparatus of claim 14, wherein the filter is a finite impulse response filter.

17. The apparatus of claim 14, wherein the filter is an infinite impulse response filter.

18. The apparatus of claim 14, wherein the set of coefficients is adjusted for error using a least mean square adaptive algorithm.

19. The apparatus of claim 14, wherein the apparatus is a receiver.

* * * * *